(12) United States Patent
Pan et al.

(10) Patent No.: US 9,735,130 B2
(45) Date of Patent: Aug. 15, 2017

(54) CHIP PACKAGES AND METHODS OF MANUFACTURE THEREOF

(71) Applicant: Taiwan Semiconductor Manufacturing Company, Ltd., Hsin-Chu (TW)

(72) Inventors: Kuo Lung Pan, Hsin-Chu (TW); Ying-Jui Huang, Zhubei (TW); Yu-Feng Chen, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/472,699

(22) Filed: Aug. 29, 2014

(65) Prior Publication Data
US 2016/0064355 A1 Mar. 3, 2016

(51) Int. Cl.
*H01L 23/04* (2006.01)
*H01L 25/065* (2006.01)
(Continued)

(52) U.S. Cl.
CPC .......... *H01L 25/0657* (2013.01); *H01L 23/04* (2013.01); *H01L 23/36* (2013.01); *H01L 23/3675* (2013.01); *H01L 25/50* (2013.01); *H01L 23/295* (2013.01); *H01L 24/05* (2013.01); *H01L 24/06* (2013.01); *H01L 24/13* (2013.01); *H01L 24/16* (2013.01); *H01L 24/17* (2013.01); *H01L 24/29* (2013.01); *H01L 24/32* (2013.01); *H01L 24/33* (2013.01); *H01L 24/73* (2013.01); *H01L 24/83* (2013.01); *H01L 24/92* (2013.01); *H01L 25/18* (2013.01); *H01L 2224/0401* (2013.01); *H01L 2224/0557* (2013.01); *H01L 2224/05647* (2013.01); *H01L 2224/06181* (2013.01); *H01L 2224/131* (2013.01); *H01L 2224/1312* (2013.01); *H01L 2224/13109* (2013.01); *H01L 2224/13111* (2013.01); *H01L 2224/13113* (2013.01); *H01L 2224/13116* (2013.01); *H01L 2224/13118* (2013.01); *H01L 2224/13123* (2013.01); *H01L 2224/13139* (2013.01); *H01L 2224/13144* (2013.01); *H01L 2224/13147* (2013.01); *H01L 2224/16145* (2013.01); *H01L 2224/16227* (2013.01);
(Continued)

(58) Field of Classification Search
CPC ........ H01L 23/04–23/057; H01L 2225/06582; H01L 2225/06586; H01L 2225/06589; H01L 25/043; H01L 25/0657; H01L 25/074; H01L 25/0756
See application file for complete search history.

(56) References Cited

U.S. PATENT DOCUMENTS 5,907,474 A * 5/1999 Dolbear .................. H01L 23/04
257/E23.084
6,840,777 B2 * 1/2005 Sathe ..................... H01L 23/055
257/E23.063
(Continued)

*Primary Examiner* — Xinning Niu
*Assistant Examiner* — Sean Hagan
(74) *Attorney, Agent, or Firm* — Slater Matsil, LLP

(57) ABSTRACT

A chip package may include: a first die; at least one second die disposed over the first die; and a lid disposed over lateral portions of the first die and at least partially surrounding the at least one second die, the lid having inclined sidewalls spaced apart from and facing the at least one second die.

22 Claims, 8 Drawing Sheets

(51) Int. Cl.
   H01L 25/00   (2006.01)
   H01L 23/367  (2006.01)
   H01L 23/36   (2006.01)
   H01L 23/00       (2006.01)
   H01L 23/29       (2006.01)
   H01L 25/18       (2006.01)

(52) U.S. Cl.
   CPC .......... *H01L 2224/1703* (2013.01); *H01L 2224/17181* (2013.01); *H01L 2224/2919* (2013.01); *H01L 2224/2929* (2013.01); *H01L 2224/29488* (2013.01); *H01L 2224/32225* (2013.01); *H01L 2224/32245* (2013.01); *H01L 2224/33181* (2013.01); *H01L 2224/73203* (2013.01); *H01L 2224/73204* (2013.01); *H01L 2224/73253* (2013.01); *H01L 2224/81203* (2013.01); *H01L 2224/81815* (2013.01); *H01L 2224/8385* (2013.01); *H01L 2224/83862* (2013.01); *H01L 2224/83868* (2013.01); *H01L 2224/92125* (2013.01); *H01L 2225/0652* (2013.01); *H01L 2225/06513* (2013.01); *H01L 2225/06517* (2013.01); *H01L 2225/06541* (2013.01); *H01L 2225/06555* (2013.01); *H01L 2225/06589* (2013.01); *H01L 2225/06596* (2013.01); *H01L 2924/141* (2013.01); *H01L 2924/1421* (2013.01); *H01L 2924/1431* (2013.01); *H01L 2924/1433* (2013.01); *H01L 2924/1434* (2013.01); *H01L 2924/1436* (2013.01); *H01L 2924/1437* (2013.01); *H01L 2924/1461* (2013.01); *H01L 2924/157* (2013.01); *H01L 2924/1579* (2013.01); *H01L 2924/15311* (2013.01); *H01L 2924/15313* (2013.01); *H01L 2924/15787* (2013.01); *H01L 2924/1659* (2013.01); *H01L 2924/1676* (2013.01); *H01L 2924/1679* (2013.01); *H01L 2924/16151* (2013.01); *H01L 2924/16235* (2013.01); *H01L 2924/16251* (2013.01); *H01L 2924/16724* (2013.01); *H01L 2924/16747* (2013.01); *H01L 2924/18161* (2013.01)

(56) References Cited

U.S. PATENT DOCUMENTS

| | | | | |
|---|---|---|---|---|
| 7,592,697 | B2 * | 9/2009 | Arana et al. | 257/714 |
| 7,781,883 | B2 * | 8/2010 | Sri-Jayantha et al. | 257/712 |
| 7,943,421 | B2 * | 5/2011 | Wu et al. | 438/107 |
| 8,299,608 | B2 * | 10/2012 | Bartley et al. | 257/712 |
| 2009/0283902 | A1 * | 11/2009 | Bezama | H01L 23/3675 257/713 |
| 2009/0321948 | A1 * | 12/2009 | Wang | H01L 24/33 257/777 |
| 2010/0019377 | A1 * | 1/2010 | Arvelo | H01L 21/563 257/712 |
| 2013/0119528 | A1 * | 5/2013 | Groothuis | H01L 23/36 257/690 |

* cited by examiner

CHIP PACKAGES AND METHODS OF MANUFACTURE THEREOF

BACKGROUND

Since the invention of the integrated circuit, the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required. An additional limit comes from the significant increase in the number and length of interconnections between devices as the number of devices increases. When the number and length of interconnections increase, both circuit RC delay and power consumption increase.

Three-dimensional (3D) integrated circuits (ICs) help to resolve the above-discussed limitations. Technologies in 3D IC include wafer-on-wafer, die-on-wafer and die-on-die. In a typical formation process of wafer-on-wafer 3D IC, a plurality of wafers, each including an integrated circuit, are formed. The wafers are then bonded with the devices aligned. Much higher device density has been achieved using 3D IC technology. Accordingly, 3D IC technology has the potential of being the mainstream technology of the next generation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
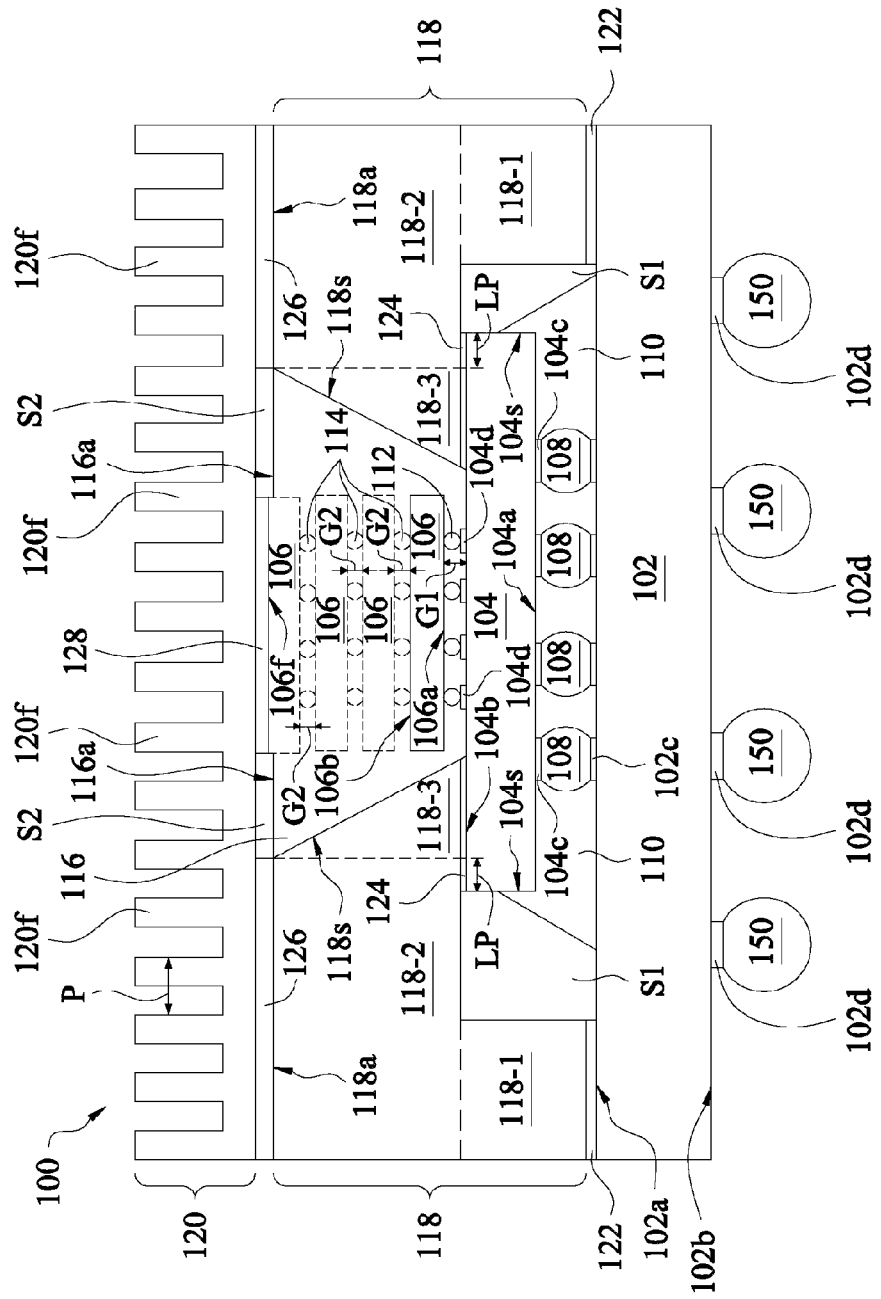
FIG. 1 shows a chip package, in accordance with some embodiments.

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a chip package 100, in accordance with one or more embodiments. The chip package 100 may include a substrate 102, a first die 104, at least one second die 106, a lid 118, and a heat sink 120 arranged in the manner shown in the embodiment of FIG. 1. The first die 104 may be disposed over (e.g. stacked over) the substrate 102, and the at least one second die 106 may be disposed over (e.g. stacked over) the first die 104. In an embodiment, the substrate 102 may include a semiconductor substrate. The semiconductor substrate may include an elementary semiconductor (e.g. including silicon and/or germanium in crystal), a compound semiconductor (e.g. including at least one of silicon carbide, gallium arsenic, gallium phosphide, indium phosphide, indium arsenide, or indium antimonide), an alloy semiconductor (e.g. including at least one of SiGe, GaAsP, AlInAs, AlGaAs, GaInAs, GaInP, or GaInAsP), or combinations thereof.

In another embodiment, the substrate 102 may include a customer board, a printed circuit board, or an interposer board that may, for example, be used in an end-user application. In such an embodiment, the substrate 102 may be formed by a lamination or pressing process, although other methods of forming the substrate 202 may be possible as well. As an example of this embodiment, the substrate 202 may include a laminate material. By way of another example of this embodiment, the substrate 202 may include an epoxy polymer containing a filler material (e.g. glass fiber). By way of yet another example, the substrate 102 may include FR4 and/or bis-maleimidetriazine (BT). By way of a further example of this embodiment, the substrate 102 may include an organic resin and/or a ceramic material. In such an example, the substrate 102 may include spin coated dielectric materials and RDLs and/or organic substrate with lamination of copper foils, dielectric film on a BT and/or FR4 core.

The substrate 102 may have a first surface 102a and a second surface 102b opposite the first surface 102a. As an example, the first surface 102a and the second surface 102b of the substrate 102 may be a top side and a bottom side of the substrate 102, respectively. The substrate 102 may include a plurality of contact pads 102c formed at the first surface 102a of the substrate 102. In the example of FIG. 1, the plurality of contact pads 102c are shown as being disposed atop the first surface 102a of the substrate 102. However, in another embodiment, the plurality of contact pads 102c may be substantially co-planar with the first surface 102a of the substrate 102. Only four contact pads 102c are shown as an example, however, the number of contact pads 102c may be less than four (e.g. one, two, or three) or may be more than four (e.g. five, six, seven, or more), in accordance with some embodiments. The substrate 102 may additionally include a plurality of contact pads 102d that may be formed at the second surface 102b of the substrate 102. In the example of FIG. 1, the plurality of contact pads 102d are shown as being disposed atop the second surface 102b of the substrate 102. However, in another embodiment, the plurality of contact pads 102d may be substantially co-planar with the second surface 102b of the substrate 102. Only four contact pads 102d are shown as an example, however, the number of contact pads 102d may be less than four (e.g. one, two, or three) or may be more than four (e.g. five, six, seven, or more), in accordance with some embodiments. The plurality of contact pads 102c and 102d of the substrate 102 may include an electrically conductive material (e.g. including copper or an alloy thereof). Methods of forming contact pads on a substrate are known in the art and are not described here for the sake of brevity.

The substrate 102 may include a redistribution layer (RDL) (not shown in FIG. 1) or at least one via (also not shown in FIG. 1). The RDL and/or the at least one via of the substrate 102 may be partially or fully disposed within (e.g. partially or fully embedded within) the substrate 102. The RDL or the at least one via of the substrate 102 may redistribute and/or re-map electrical connections from the plurality of contacts pads 102c at the first surface 102a of the substrate 102 to the plurality of contacts pads 102d at the second surface 102b of the substrate 102. The substrate 102 may include at least one circuit component (not shown in FIG. 1) that may, for example, be embedded within the substrate 102. The at least one circuit component may include a passive circuit component (e.g. a resistor, capacitor, inductor) and/or an active circuit component (e.g. a transistor or another chip).

The chip package 100 may include a first plurality of connectors 150 that may be disposed at the second surface 102b of the substrate 102. For example, the first plurality of connectors 150 may be disposed over and may be coupled to (e.g. electrically coupled to) the contact pads 102d disposed at the second surface 102b of the substrate 102. In an embodiment, the first plurality of connectors 150 may include controlled collapse chip connection (C4) bumps and/or micro bumps. In another embodiment, the first plurality of connectors 150 may include a ball grid array (BGA). In such an embodiment, the first plurality of connectors 150 may be referred to as a bottom-side BGA. The first plurality of connectors 150 may include an electrically conductive material (e.g. a metal or metal alloy). For example, the first plurality of connectors 150 may include a solder material. By way of another example, the first plurality of connectors 150 may include at least one of tin, lead, copper, gold, silver, zinc, bismuth, magnesium, antimony, indium or an alloy thereof.

The chip package 100 may include the first die 104, which may be disposed over (e.g. stacked over) the substrate 102. The first die 104 may be a die that may have been singulated from a wafer including a plurality of chips. The first die 104 may be used in one or more applications. For example, in an embodiment, the first die 104 may be used in microelectromechanical systems (MEMS), logic, memory, power, analog or radiofrequency (RF) communications applications, although other applications may be possible as well in accordance with other embodiments. As an example, in a logic and memory application, the first die 104 may include a logic chip.

The first die 104 may have a first surface 104a and a second surface 104b opposite the first surface 104a. The first surface 104a of the first die 104 may face the first surface 102a of the substrate 102, as shown in FIG. 1. The first die 104 may include a plurality of contact pads 104c formed at the first surface 104a. In the example of FIG. 1, the plurality of contact pads 104c are shown as being disposed atop the first surface 104a of the first die 104. However, in another embodiment, the plurality of contact pads 104c may be substantially co-planar with the first surface 104a of the first die 104. Only four contact pads 104c are shown as an example, however, the number of contact pads 104c may be less than four (e.g. one, two, or three) or may be more than four (e.g. five, six, seven, or more), in accordance with some embodiments.

The first die 104 may additionally include a plurality of contact pads 104d formed at the second surface 104b. In the example of FIG. 1, the plurality of contact pads 104d are shown as being disposed atop the second surface 104b of the first die 104. However, in another embodiment, the plurality of contact pads 104d may be substantially co-planar with the second surface 104b of the first die 104. Only four contact pads 104d are shown as an example, however, the number of contact pads 104d may be less than four (e.g. one, two, or three) or may be more than four (e.g. five, six, seven, or more), in accordance with some embodiments. The plurality of contact pads 104c and 104d may include an electrically conductive material (e.g. including copper or an alloy thereof). Methods of forming contact pads on a surface of a chip are known in the art and are not described here for the sake of brevity. In an embodiment, the plurality of contact pads 104c at the first surface 104a of the first die 204 may be electrically connected to the plurality of contact pads 104d at the second surface 104b of the first die 104 by a plurality of vias (not shown in FIG. 1) disposed within (e.g. embedded within) the first die 104.

The first die 104 may additionally include passivation layers, dielectric layers, and under bump metallization (UBM) layers formed at the first surface 104a and/or second surface 104b of the first die 104. These features of the first die 104 are not shown in FIG. 1 for the sake of simplicity. The passivation layers, dielectric layers, and UBM layers may, for example, be disposed over at least a portion of the first surface 104a, the second surface 104b, and the plurality of contact pads 104c and 104d of the first die 104.

As shown in FIG. 1, the chip package 100 may include a second plurality of connectors 108 that may be disposed between the first surface 104a of the first die 104 and the first surface 102a of the substrate 202. Only four connectors 108 are shown as an example, however, the number of connectors 108 may be less than four (e.g. one, two, or three) or more than four (e.g. five, six, seven, or more) in accordance with some embodiments. The second plurality of connectors 108 may electrically and mechanically connect the first die 104 and the substrate 102 to each other. For example, the second plurality of connectors 108 may electrically and mechanically connect the plurality of contact pads 102c of the substrate 102 and the plurality of contact pads 104c of the first die 104 to each other, as shown in FIG. 1. In an embodiment, the second plurality of connectors 108 may include controlled collapse chip connection (C4) bumps and/or micro bumps. In the example shown in FIG. 1, the connectors of the second plurality of connectors 108 have a spherical shape (e.g. balls). However, in another embodiment the second plurality of connectors 108 may have another shape, e.g. pillars, posts, bumps, or caps.

The second plurality of connectors 108 may include similar material as the first plurality of connectors 150. The second plurality of connectors 108 may be formed by a reflow process and/or a thermal compression process. For example, in the embodiment where the second plurality of connectors 108 is formed by a reflow process, electrically conductive material may be deposited on the plurality of contact pads 102c of the substrate 102, and the first die 104 may be mounted face-down on the electrically conductive material deposited on the substrate 102 (e.g. in a flip-chip arrangement). In another example, electrically conductive material may be deposited on the plurality of contact pads 104c of the first die 104, and the first die 104 having the electrically conductive material on the plurality of contact pads 104c may be mounted face-down on the substrate 102 (e.g. in a flip-chip arrangement). The reflow process may subsequently be performed on the deposited electrically conductive material to form the second plurality of connectors 108 that electrically and mechanically connects the substrate 102 and the first die 104 to each other.

The chip package 100 may include an underfill layer 110 that may be disposed between the first die 104 and the substrate 102. The underfill layer 110 may additionally be disposed at one or more sidewalls 104s of the first die 104. The underfill layer 110 may enclose (e.g. surround or encapsulate) the second plurality of connectors 108. The underfill layer 110 may additionally surround or encapsulate the first die 104, as shown in FIG. 1. The underfill layer 110 may include an insulating material, which may, for example, include at least one of an epoxy material, a polyurethane material or an epoxy blend including two or more epoxy materials. The underfill layer 110 may be filled with filler particles, such as silica filler, glass filler or similar fillers.

The underfill layer 110 may formed by at least one of capillary dispensing, jetting of a liquid underfill material where a fillet of underfill material forms around a perimeter or periphery of the first die 104 (e.g. as shown in FIG. 1), and lamination of a non-conductive film where a fillet of underfill material is not formed around the perimeter or periphery of the first die 104. In an example of lamination, the underfill layer 110 may be disposed between the first surface 104a of the first die 104 and the first surface 102a of the substrate 102, while the sidewalls 104s of the first die 104 are substantially free from the underfill layer 110. In an example of capillary dispensing and/or jetting of a liquid underfill material, the liquid underfill material may be dispensed (e.g. in one or more dispense passes) at or near the sidewalls 104s of the first die 104. The dispensed liquid underfill material may subsequently flow via capillary action in a space between the first die 104 and the substrate 102 and in so doing, encapsulate the second plurality of connectors 108 and fill the space between the first die 104 and the substrate 102. The underfill material disposed between the first die 104 and the substrate 102 may be subsequently cured (e.g. by a conduction, convection, laser, radio-frequency, or infrared heating process) to form the underfill layer 110.

The chip package 100 may include the at least one second die 106, which may be disposed over (e.g. stacked over) the first die 104. The at least one second die 106 may be a die that may have been singulated from a wafer including a plurality of chips. The at least one second die 106 may be used in one or more applications, such as the examples stated above in respect of the first die 104. As an example, in a logic and memory application, the at least one second die 106 may include a memory chip or a stack of memory chips. As an example, the at least one second die 106 may include at least one random access memory chip, examples of which include a high speed synchronous dynamic random access memory (SRAM) chip, and at least one wide input-output (I/O) memory chip (e.g. a wide I/O DRAM). As a further example, the at least one second die 106 may be an application-specific integrated circuit (ASIC).

The at least one second die 106 may have a first surface 106a and a second surface 106b opposite the first surface 106a. The first surface 106a of the at least one second die 106 may face the second surface 104b of the first die 104, as shown in FIG. 1. The at least one second die 106 may include a plurality of contact pads (not shown in FIG. 1) formed at the first surface 106a and/or the second surface 106b. The plurality of contact pads may include an electrically conductive material (e.g. including copper or an alloy thereof). Methods of forming contact pads on a surface of a chip are known in the art and are not described here for the sake of brevity. In an embodiment, the plurality of pads at the first surface 106a of the at least one second die 106 may be electrically connected to the plurality of pads at the second surface 106b of the at least one second die 106 by a plurality of vias (not shown in FIG. 1) disposed within (e.g. embedded within) the at least one second die 106.

The at least one second die 106 may additionally include passivation layers, dielectric layers, and under bump metallization (UBM) layers formed at the first surface 106a and/or second surface 106b of the at least one second die 106. These features of the at least one second die 106 are not shown in FIG. 1 for the sake of simplicity. The passivation layers, dielectric layers, and UBM layers may, for example, be disposed over at least a portion of the first surface 106a, the second surface 106b, and the plurality of contact pads of the at least one second die 106.

As shown in FIG. 1, the chip package 100 may include a third plurality of connectors 112 that may be disposed between the first surface 106a of the at least one second die 106 and the second surface 104b of the first die 104. Only four connectors 112 are shown as an example, however, the number of connectors 112 may be less than four (e.g. one, two, or three) or more than four (e.g. five, six, seven, or more) in accordance with some embodiments. The third plurality of connectors 112 may electrically and mechanically connect the at least one second die 106 and the first die 104 to each other. For example, the third plurality of connectors 112 may electrically and mechanically connect the plurality of contact pads 104d of the first die 104 and the at least one second die 106 to each other, as shown in FIG. 1. In an embodiment, the third plurality of connectors 112 may include controlled collapse chip connection (C4) bumps and/or micro-bumps. In the example shown in FIG. 1, the third plurality of connectors 112 may have a spherical shape (e.g. balls). However, in another embodiment the third plurality of connectors 112 may have another shape, e.g. pillars, posts, bumps, or caps. The third plurality of connectors 112 may include similar materials as the second plurality of connectors 108. The third plurality of connectors 112 may be formed by a similar process as the second plurality of connectors 108.

In some embodiments, as in the example shown in FIG. 1, the at least one second die 106 may include a plurality of vertically stacked second dies 106. Only four vertically stacked second dies 106 are shown in the example of FIG. 1, however, the number of vertically stacked second dies 106 disposed over (e.g. vertically stacked over) the first die 104 may be less than four (e.g. two or three) or may be more than four (e.g. five, six, seven, or more), in accordance with other embodiments. In the embodiment where the at least one second die 106 includes the plurality of vertically stacked second dies 106, the first die 104 may have a multi-layer chip stack disposed over the second surface 104b of the first die 104. In such an embodiment, the first die 104 may be electrically and/or communicatively connected to the plurality of vertically stacked second dies 106 by a plurality of vias (not shown in FIG. 1) formed in the second dies of the plurality of vertically stacked second dies 106.

The plurality of vertically stacked second dies 106 may also be electrically connected to each other by a fourth plurality of connectors 114, which may disposed between immediately adjacent second dies 106 (e.g. a second die 106 immediately above or immediate below another second die 106). In an embodiment, the fourth plurality of connectors 114 may include controlled collapse chip connection (C4) bumps and/or micro bumps. In the example shown in FIG. 1, the fourth plurality of connectors 114 has a spherical shape (e.g. balls). However, in another embodiment the fourth plurality of connectors 114 may have another shape, e.g. pillars, posts, bumps, or caps. The fourth plurality of connectors 114 may include similar materials as the second plurality of connectors 108. The fourth plurality of connectors 114 may be formed by a similar process as the second plurality of connectors 108.

The chip package 100 may include the lid 118 that may at least partially encircle or surround the underfill layer 110, first die 104, and the at least one second die 106, as shown in FIG. 1. For example, in an embodiment, the lid 118 may be disposed around all four sides of the underfill layer 110, first die 104, and the at least one second die 106. As another example, the lid 118 may be disposed around some, but not all, the four sides of the underfill layer 110, first die 104, and the at least one second die 106. The lid 118 may be laterally adjacent to and spaced apart from the underfill layer 110, first die 104, and the at least one second die 106. The lid 118 may function as a heat sink (e.g. a structure that dissipates heat generated in or by the first die 104 and the at least one second die 106). The lid 118 may include a thermally conductive material. Examples include aluminum, copper, tungsten, diamond, alloys thereof, and the like. In another embodiment, the lid 118 may include a polymer (e.g. a nanomaterial polymer). In yet another embodiment, the lid 118 may include teflon. In a further embodiment, the lid 118 may include a conductive material (e.g. iron or an alloy thereof, e.g. steel).

The lid 118 may include first portions 118-1 disposed over the first surface 102a of the substrate 102. The first portions 118-1 of the lid 118 may be laterally adjacent to and spaced apart from the first die 104 and the underfill layer 110. As a consequence, there may be first air gaps S1 disposed between the first portions 118-1 of the lid 118 and the underfill layer 110 and/or between the first portions 118-1 of the lid 118 and the first die 104.

The lid 118 may include second portions 118-2, which may be disposed over the first portions 118-1. For example, the second portions 118-2 of the lid 118 may be disposed directly atop (e.g. and be in direct physical contact with) the first portions 118-1 of the lid 118. The second portions 118-2 of the lid 118 may extend towards the at least one second die 106. As shown in FIG. 1, the second portions 118-2 of the lid 118 may additionally overhang or be disposed over lateral portions LP of the first die 104. As a consequence, the second portions 118-2 of the lid 118 may be disposed over the first air gaps S1.

The lid 118 may further include third portions 118-3 disposed laterally adjacent to the second portions 118-2 of the lid 118 on the side of the second portions 118-2 of the lid 118 proximate the at least one second die 106. As shown in FIG. 1, the third portions 118-3 of the lid 118 may be in direct physical contact with the second portions 118-2 of the lid 118. The third portions 118-3 of the lid 118 may be laterally adjacent to and spaced apart from the at least one second die 106. The second portions 118-2 and the third portions 118-3 of the lid 118 may collectively be referred to as overhanging portions of the lid 118 since the second portions 118-2 and the third portions 118-3 of the lid 118 overhang the lateral portions LP of the first die 104 as well as the first air gaps S1. As shown in FIG. 1, the third portions 118-3 of the lid may include inclined sidewalls 118s, which may face the at least one second die 106. The inclined sidewalls 118s may also be referred to as tapered sidewalls 118s.

The lid 118 may be held in place (e.g. secured) by a first adhesive layer 122 and a second adhesive layer 124. For example, the first adhesive layer 122 may be disposed between the first portions 118-1 of the lid 118 and the first surface 102a of the substrate 102, thus securing the lid 118 (e.g. the first portions 118-1 of the lid 118) to the substrate 102 of the chip package 100. As shown in FIG. 1, the second adhesive layer 124 may be disposed between the second surface 104b of the first die 104 and the third portions 118-3 of the lid 118. The second adhesive layer 124 may additionally be disposed between the second surface 104b of the first die 104 and a section of the second portions 118-2 of the lid 118 that overhangs or is disposed over the lateral portion LP of the first die 104. Thus, the lid 118 (e.g. the third portions 118-3 of the lid 118 and a section of the second portions 118-2 of the lid 118) may be secured to the first die 104.

The first adhesive layer 122 and the second adhesive layer 124 may include glue, a polymer material, a die attach film (DAF), and the like. In an embodiment, the first adhesive layer 122 and the second adhesive layer 124 may each have a thickness in a range from about 5 micrometers to about 100 micrometers, e.g. in a range from about 10 micrometers to about 80 micrometers, e.g. in a range from about 30 micrometers to about 60 micrometers, e.g. about 40 micrometers, although other thicknesses may be possible as well in accordance with other embodiments.

As shown in FIG. 1, there may be a first standoff gap G1 between the first die 104 and the at least one second die 106. The first standoff gap G1 may be a gap (e.g. an air gap) or a space between the second surface 104b of the first die 104 and the first surface 106a of the at least one second die 106 that is subsequently filled with an encapsulant (e.g. a molding compound). The first standoff gap G1 may be formed as a result of the third plurality of connectors 112 being disposed between the first die 104 and the at least one second die 106. Similarly, in the embodiment where the at least one second die 106 includes the plurality of vertically stacked second dies 106 (as in the example of FIG. 1), there may be a second standoff gap G2 between immediately adjacent second dies 106. The second standoff gap G2 may be a gap (e.g. an air gap) or a space between the first surface 106a of a second die 106 and the second surface 106b of an immediately adjacent second die 106 that is subsequently filled with an encapsulant (e.g. a molding compound). The second standoff gap G2 may be formed as a result of the fourth plurality of connectors 114 being disposed between immediately adjacent second dies.

As shown in FIG. 1, the chip package 100 may include a molding compound 116 that may encapsulate at least a portion of the at least one second die 106. Furthermore, the molding compound 116 may be disposed in the first standoff gap G1 and the second standoff gaps G2, filling these gaps. As shown in FIG. 1, a surface 116a of the molding compound 116 facing away from the first die 104 may be substantially co-planar with a surface 118a of the lid 118 facing away from the substrate 102 (e.g. facing away from the first surface 102a of the substrate 102). In the embodiment shown in FIG. 1, the surface of the at least one second die 106 farthest from the first die 104 (labeled as surface 106f in FIG. 1), is not substantially co-planar with the surface 116a of the molding compound 116 facing away from the first die 104. In such an embodiment, the surface 106f of the at least one second die 106 may be farther from the second surface 104b of the first die 104 than the surface 116a of the molding compound 116 facing away from the first die 104. In other words, in the example shown in FIG. 1, the surface 106f of the at least one second die 106 may be disposed at a level that is different from (e.g. higher than) the surface 116a of the molding compound 116 facing away from the first die 104. However, in another embodiment of the chip package 100, the surface 106f of the at least one second die 106 may be substantially co-planar with the surface 116a of the molding compound 116 facing away from the first die 104. Consequently, in such an embodiment, the surface 116a of the molding compound 116, the surface 118a of the lid 118, and the surface 106f of the at least one second die 106 may be substantially co-planar with one another.

The molding compound 116 may include an insulating material, which may, for example, include at least one of an epoxy material, a polyurethane material or an epoxy blend including two or more epoxy materials. For example, the molding compound 116 may include epoxy, polyimide, benzocyclobutene (BCB), polybenzoxazole (PBO), and the like. The molding compound 116 may be filled with filler particles, such as silica filler, glass filler or similar fillers.

The chip package 100 may include the heat sink 120, which may be disposed over the lid 118 and the at least one second die 106. For example, the heat sink 120 may be disposed over the surface 118a of the lid 118 and the surface 106f of the at least one second die 106. The heat sink 120 may function to a structure to extract or remove heat from the at least one second die 106 and/or the first die 104 that may be generated during operation and/or test of the chip package 100.

The heat sink 120 may be attached to the lid 118 by a third adhesive layer 126, which may be disposed over the surface 118a of the lid 118 and below the heat sink 120. Additionally, as shown in FIG. 1, the heat sink 120 may be attached to the at least one second die 106 (e.g. to the surface 106f of the at least one second die 106) by a fourth adhesive layer 128, which may be disposed over the surface 106f of the at least one second die 106 and below the heat sink 120. In the embodiment shown in FIG. 1 where the surface 106f of the at least one second die 106 may be disposed at a level that is different from (e.g. higher than) the surface 116a of the molding compound 116 facing away from the first die 104, a thickness of the third adhesive layer 126 may be larger than a thickness of the fourth adhesive layer 128. However, in another embodiment where the surface 106f of the at least one second die 106 may be substantially co-planar with the surface 116a of the molding compound 116 facing away from the first die 104, the thicknesses of the third adhesive layer 126 and the fourth adhesive layer 128 may be substantially equal. As a result of the third adhesive layer 126 and the fourth adhesive layer 128, there may be second air gaps S2 disposed between the third adhesive layer 126 and the fourth adhesive layer 128. The second air gaps S2 may additionally be disposed below a portion of the heat sink 120 and above the surface 116a of the molding compound 116, as shown in FIG. 1. The third adhesive layer 126 and the fourth adhesive layer 128 may include similar materials as the first adhesive layer 122 and the second adhesive layer 124. Furthermore, the thicknesses of the third adhesive layer 126 and the fourth adhesive layer 128 may be in a range similar to the range of thicknesses of the first adhesive layer 122 and the second adhesive layer 124.

In the example shown in FIG. 1, the heat sink 120 may include a plurality of fins 120f having a pitch P. The pitch P of plurality of the fins 120f of the heat sink 120 may be in a range from about 500 micrometers to about 2000 micrometers, e.g. in a range from about 1000 micrometers to about 1500 micrometers, although other thicknesses may be possible as well in accordance with other embodiments. The heat sink 120 may include a thermally conductive material. Examples include aluminum, copper, iron or an alloy thereof (e.g. steel), tungsten, diamond, alloys thereof, and the like.

Figure 2:
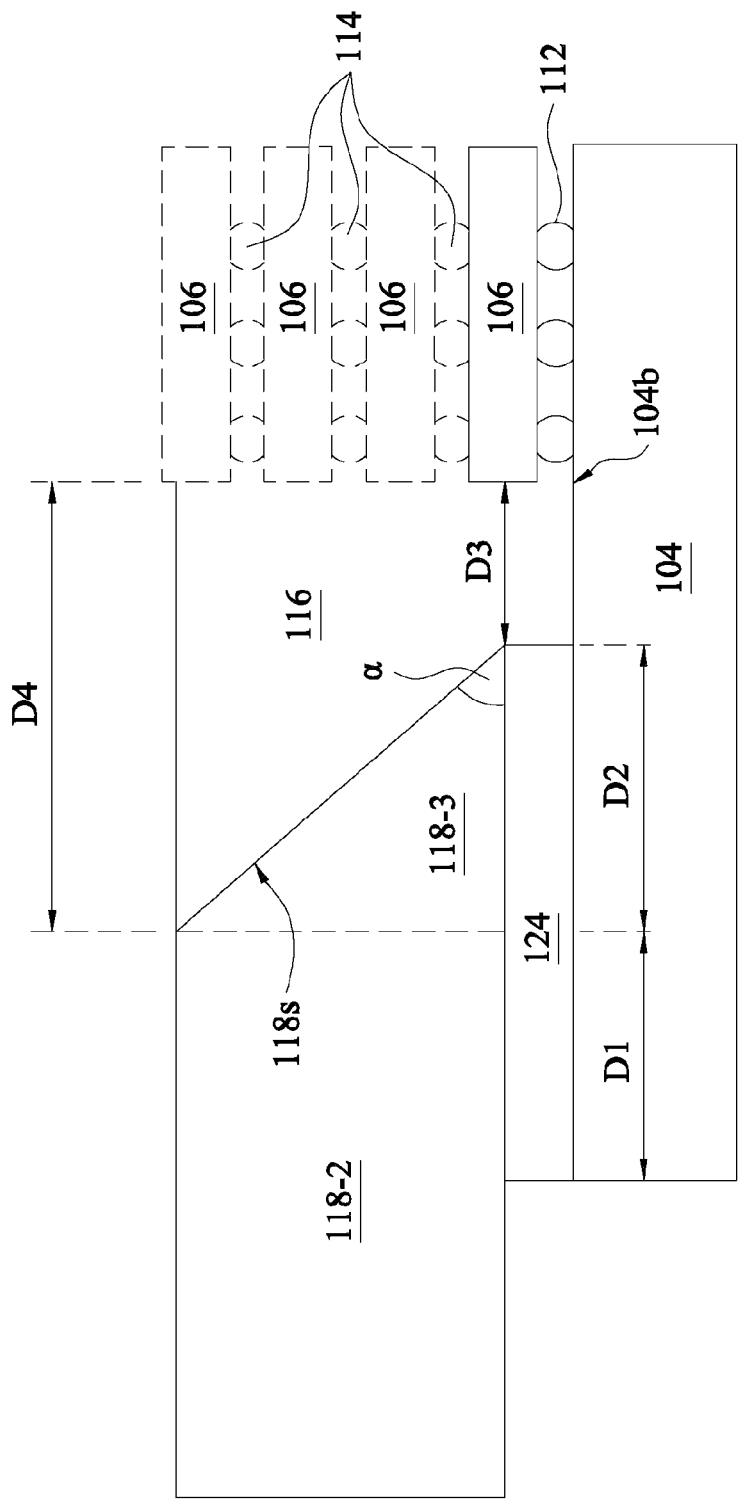
FIG. 2 shows an enlarged view of a portion of the chip package shown in FIG. 1, in accordance with some embodiments.

FIG. 2 shows in greater details a portion of the chip package 100 that includes one of the third portions 118-3 and one of the second portions 118-2 of the lid 118. As shown in FIG. 2, the second portion 118-2 of the lid 118 may overhang or be disposed over the second surface 104b of the first die 104 by a first distance D1, which may be in a range from about 300 micrometers to about 700 micrometers (e.g. about 500 micrometers). As shown in FIG. 2, the third portion 118-3 of the lid 118 may extend over the second surface 104b of the first die 104 by a second distance D2, which may be in a range from about 100 micrometers to about 500 micrometers (e.g. about 300 micrometers). As described above, the third portion 118-3 of the lid 118 may include inclined sidewalls 118s. In this regard, the portion of the inclined sidewalls 118s proximate the first die 104 may be spaced apart from the at least one second die 106 by a third distance D3, which may be in a range from about 100 micrometers to about 300 micrometers (e.g. about 200 micrometers). On the other hand, the portion of the inclined sidewalls 118s distal the first die 104 may be spaced apart from the at least one second die 106 by a fourth distance D4, which may be greater than the third distance D3. The fourth distance D4 may be in a range from about 300 micrometers to about 700 micrometers (e.g. about 500 micrometers). Furthermore, an incline angle α subtended between the inclined sidewalls 118s of the lid 118 and a surface of the lid 118 facing the second adhesive layer 124 may be in a range from about 45 degrees to about 75 degrees (e.g. about 60 degrees), although other angles may be possible as well in accordance with other embodiments.

As shown in FIG. 1, the chip package 100 may include the at least one second die 106 disposed over the first die 104. This arrangement may be convenient for 3D on-chip stacking of functional chips (e.g. 3D on-chip memory stacking), which can provide low access latency, high data bandwidth, and low power consumption. While these features may be advantageous, stacking of one or more functional chips in a 3D stack package can lead to high heat generation during operation and/or testing of the 3D stack package. However, in the chip package 100 of FIG. 1, the heat generated by the at least one second die 106 and/or the first die 104 may be efficiently and effectively removed or dissipated as a result of the lid 118 that is disposed over lateral portions LP of the first die 104, and that encircles or encompasses the at least one second die 106.

Furthermore, during manufacture of the chip package 100, the lid 118 can acts as a barrier to the molding compound 116 that is dispensed in the space between the at least one second die 106 and the inclined sidewalls 118s of the lid 118 (see description below in respect of FIGS. 4A to 4E), thus preventing bleeding of the molding compound 116 onto the underfill layer 110 and/or onto the substrate 102. By preventing the molding compound 116 from bleeding, the first air gaps S1 are provided in the chip package 100, and this can improve the thermal dissipation of heat generated in or by the first chip 104. Even further, by preventing bleeding of the molding compound 116, the need for extra process steps that may be needed to remove portions of the molding compound 116 that may have bled onto the underfill layer 110 and/or the substrate 102 is eliminated, thus reducing the cost of manufacturing the chip package 100. Provision of the lid 118, which is an effective and efficient way to dissipate thermal energy generated in the chip package 100, can also prevent or substantially reduce chip-on-chip warpage.

Another advantage of the lid 118 is that there is no restriction to the number of at least one second dies 106 that may be stacked on the first die 104 or included in the chip package 100 since the lid 118 lacks a portion that overlies or covers the surface 106f of the at least one second die 106. The lid 118 merely needs to be manufactured such that the surface 118a of the lid 118 is substantially co-planar to or at a level slightly below the surface 106f of the at least one second die 106. Even so, the encapsulation of these large number of at least one second dies 106 is made easier by the lid 118, which as described above, acts as a barrier to the molding compound 116 that is dispensed in the space between the at least one second die 106 and the inclined sidewalls 118s of the lid 118.

FIG. 2 shows that the lid 118 may overhang or be disposed over the first die 104 by a distance that is equal to the sum of the first distance D1 and the second distance D2. The sum may be in a range from about 600 micrometers to about 1000 micrometers, e.g. about 800 micrometers. By arranging the second portions 118-2 and the third portions 118-3 of the lid 118 in this manner, contact area between the lid 118 and the first die 104 may be maximized while still providing sufficient space for dispensing of the molding compound 116 between the at least one second die 106 and the inclined sidewalls 118s of the lid 118. Consequently, thermal dissipation area on the first die 104 (which may be a bottom accelerated processing unit (APU) may be maximized, thus allowing efficient and effect thermal dissipation of heat generated in or by the first die 104.

Figure 3:
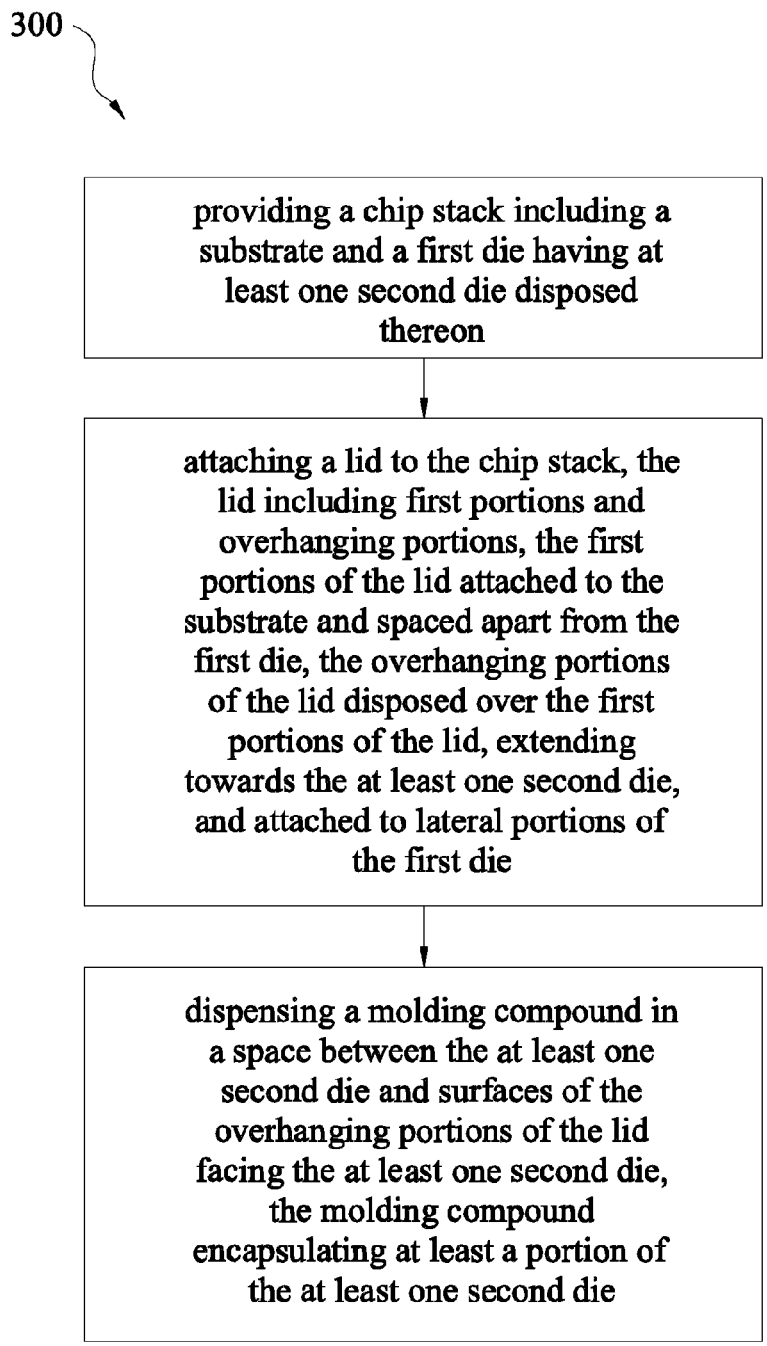
FIG. 3 shows a method of manufacturing a chip package, in accordance with some embodiments.

FIG. 3 shows a method 300 for manufacturing a chip package. The method 300 may be used to manufacture the chip package 100 shown in FIG. 1, as an example. The method 300 may include: providing a chip stack including a substrate and a first die having at least one second die disposed thereon (in 302); attaching a lid to the chip stack, the lid including first portions and overhanging portions, the first portions of the lid attached to the substrate and spaced apart from the first die, the overhanging portions of the lid disposed over the first portions of the lid, extending towards the at least one second die, and attached to lateral portions of the first die (in 304); and dispensing a molding compound in a space between the at least one second die and surfaces of the overhanging portions of the lid facing the at least one second die, the molding compound encapsulating at least a portion of the at least one second die (in 306).

FIGS. 4A to 4E show a process flow illustrating the method 300 shown in FIG. 3, in accordance with some embodiments. The process flow shown in FIGS. 4A to 4E may, for example, be an intermediate stage of manufacture of a chip package. The description that follows describes the method 300 in the context of manufacturing a die-on-die 3D chip package. However, it may be noted that the method 300 may analogously be applied to the manufacture of other 3D chip packages, such as a wafer-on-wafer 3D chip package and a die-on-wafer 3D chip package.

Figure 4A:
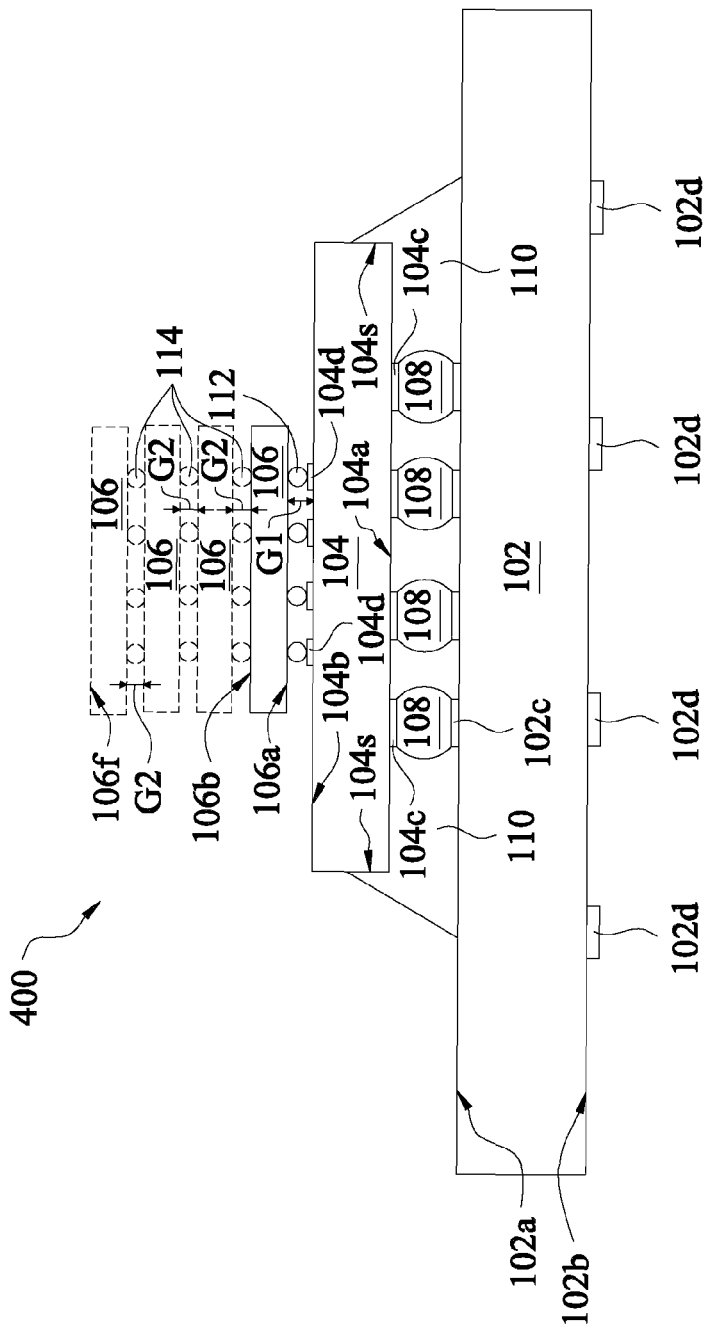
FIGS. 4A to 4E show a process flow illustrating the method shown in FIG. 3, in accordance with some embodiments.

FIG. 4A shows a chip stack 400 including the substrate 102, the first die 104, and at least one second die 106. The first die 104 may be disposed over (e.g. stacked over) the substrate 102, and the at least one second die 106 may be disposed over (e.g. stacked over) the first die 104. The first die 104 may be electrically and mechanically coupled to the substrate 102 by the second plurality of connectors 108, while the at least one second die 106 may be electrically and mechanically coupled to the first die 104 by the third plurality of connectors 112. As shown in FIG. 4A, the underfill layer 110 may be disposed between the first die 104 and the substrate 102. The underfill layer 110 may encapsulate the second plurality of connectors 108. As shown in FIG. 4A, the first standoff gap G1 and the second standoff gap G2 may be air gaps.

Figure 4B:
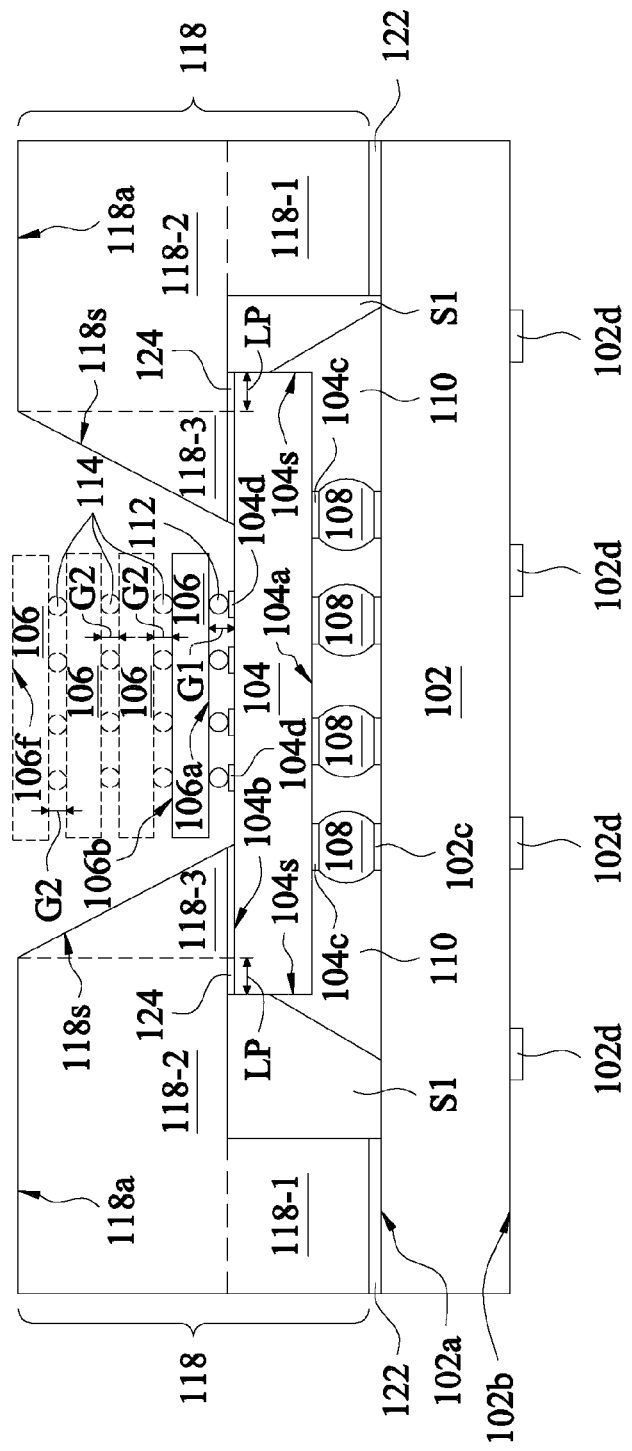

As shown in FIG. 4B, the lid 118 may be attached to the substrate 102 and to the lateral portions LP of the first die 104. The inclined sidewalls 118s of the lid 118 may be laterally adjacent to and spaced apart from the at least one second die 106, while the first portions 118-1 of the lid 118 may be disposed laterally adjacent to and spaced apart from the underfill layer 110 and the first die 104. The first adhesive layer 122 may secure the first portions 118-1 of the lid 118 to the substrate 102, while the second adhesive layer 124 may secure the second portions 118-2 of the lid 118 to the first die 104. In an embodiment, the first adhesive layer 122 and the second adhesive layer 124 may be attached to the lid 118, and the combination of the first adhesive layer 122, the second adhesive layer 124, and the lid 118 may subsequently be attached to the substrate 102 and the first die 104. However, in another embodiment, the first adhesive layer 122 and the second adhesive layer 124 may be attached to the substrate 102 and the first die 104, respectively. In such an embodiment, the lid 118 may thereafter be attached to the first adhesive layer 122 and the second adhesive layer 124.

Figure 4C:
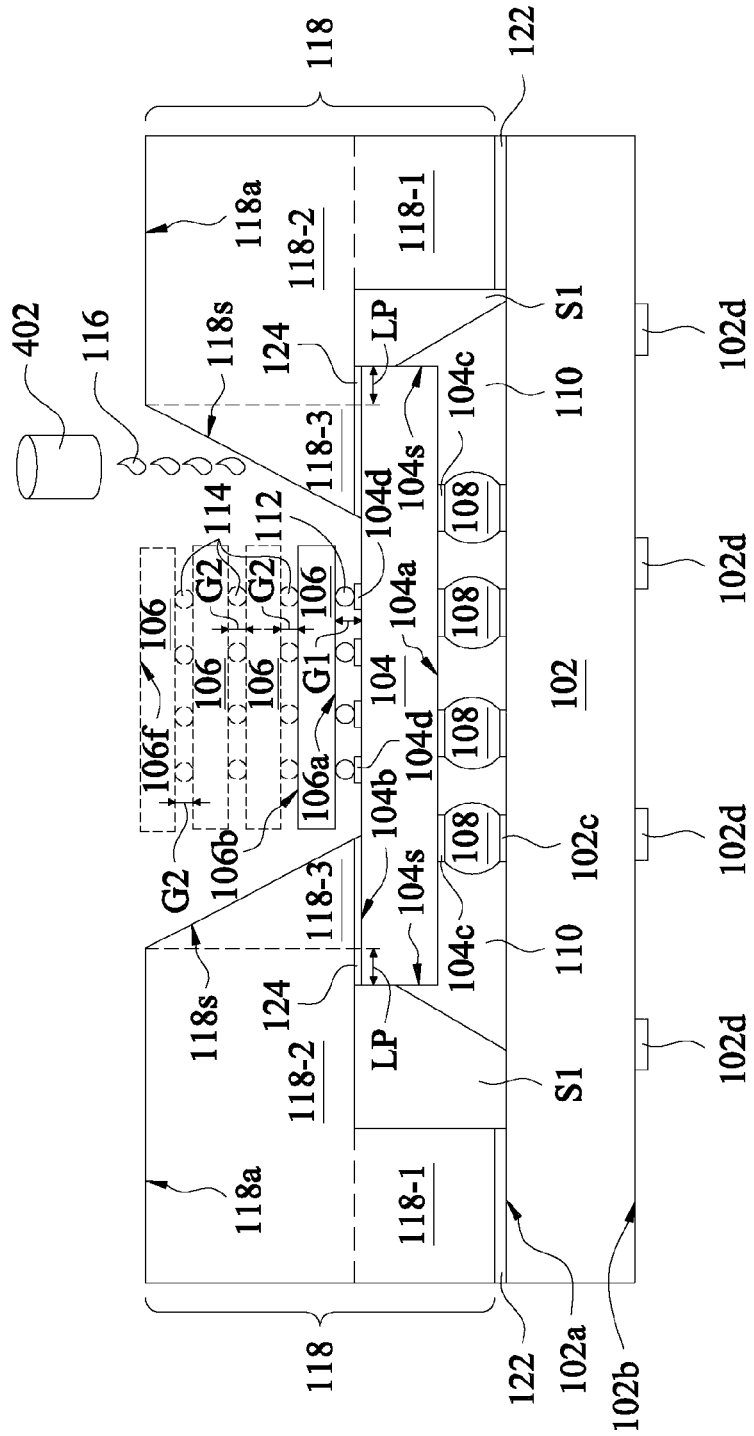

As shown in FIG. 4C, a dispenser head 402 may be positioned above the space between the inclined sidewalls 118s of the lid 118 and the at least one second die 106. The molding compound 116 may be dispensed from the dispenser head 402 (e.g. by means of a jetting process) into the space between the inclined sidewalls 118s of the lid 118 and the at least one second die 106. The molding compound 116 may be dispensed in multiple (e.g. two or more) dispense passes, and the molding compound 116 may flow through the first standoff gap G1 and the second standoff gap G2 (e.g. by capillarity) and may further surround the at least one second die 106, thus encapsulating at least a portion of the at least one second die 106. The molding compound 116 may subsequently be cured. As described above, the lid 118 prevents bleeding of the molding compound 116 onto the underfill layer 110 and/or onto the substrate 102, thus providing the first air gaps S1 in the chip package 100, which can improve the thermal dissipation of heat generated in or by the first chip 104. Even further, by preventing bleeding of the molding compound 116, the need for extra process steps that may be needed to remove portions of the molding compound 116 that may have bled onto the underfill layer 110 and/or the substrate 102 is eliminated, thus reducing the cost of manufacturing the chip package 100.

Figure 4D:
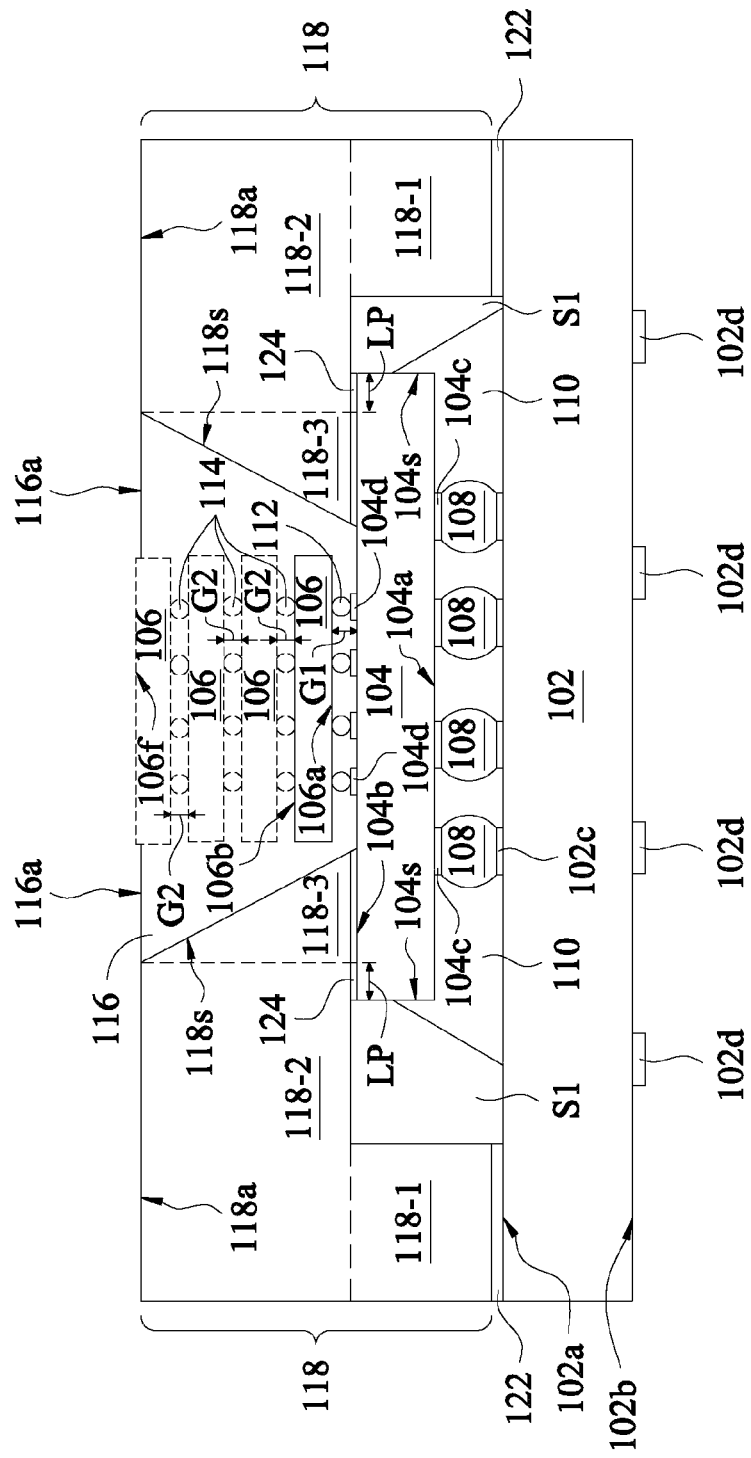

As shown in FIG. 4D, after a sufficient volume of molding compound 116 is provided, and after a sufficient amount of time is provided for the molding compound 116 to encapsulate at least a portion of the at least one second die 106, the surface 116a of the molding compound 116 facing away from the first die 104 may be substantially co-planar with the surface 118a of the lid 118 facing away from the substrate 102.

Figure 4E:
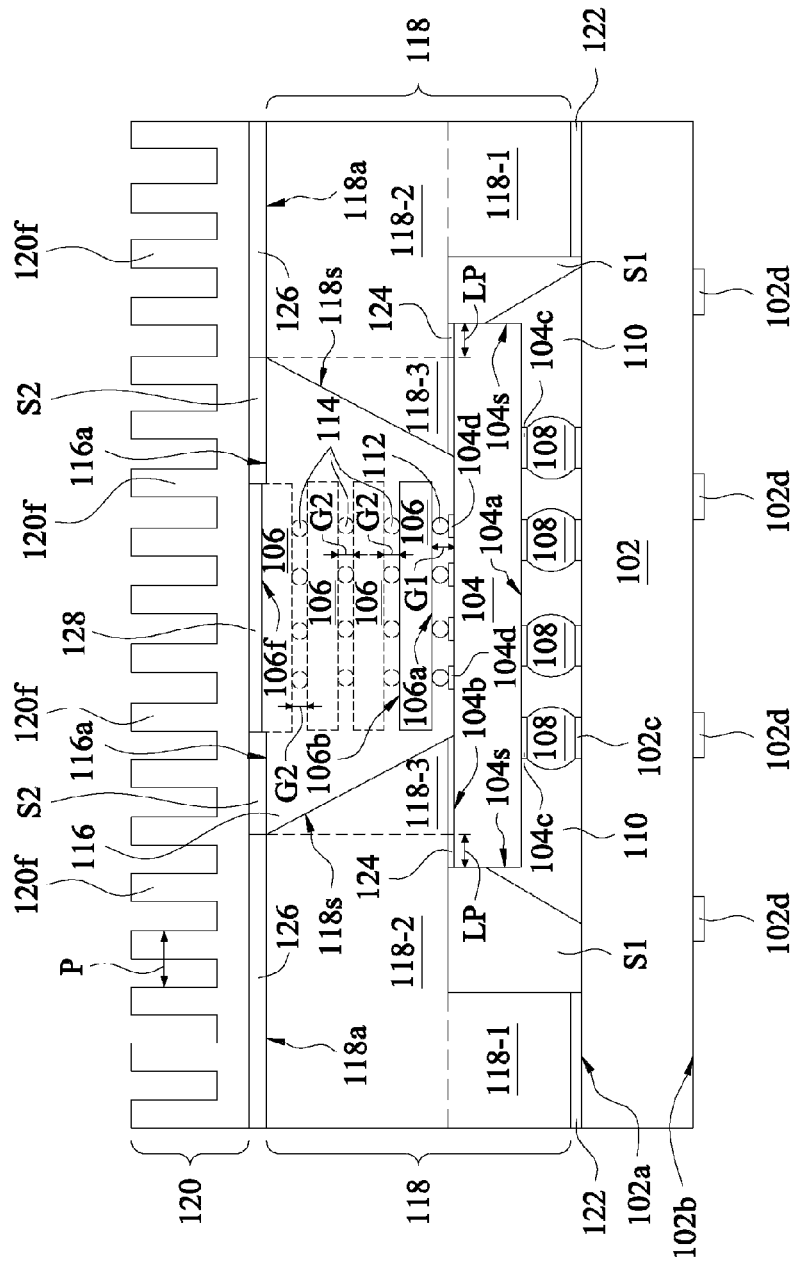

As shown in FIG. 4E, the heat sink 120 may be attached to the lid 118 and the at least one second die 106 using the third adhesive layer 126 and the fourth adhesive layer 128. In an embodiment, the third adhesive layer 126 and the fourth adhesive layer 128 may be attached to the heat sink 120, and the combination of the third adhesive layer 126, the fourth adhesive layer 128, and the heat sink 120 may subsequently be attached to the lid 118 and the at least one second die 106. However, in another embodiment, the third adhesive layer 126 and the fourth adhesive layer 128 may be attached to the lid 118 and the at least one second die 106, respectively. In such an embodiment, the heat sink 120 may thereafter be attached to the third adhesive layer 126 and the fourth adhesive layer 128.

Subsequent to the step shown in FIG. 4E, the first plurality of connectors 150 may be formed at the second surface 102b of the substrate 102. However, in another embodiment of the process flow shown in FIGS. 4A to 4E, the first plurality of connectors 150 may already be formed at the second surface 102b of the substrate 102 prior to the disposal of the lid 118 over the substrate 102 and the first die 104.

According to various embodiments presented herein, a chip package may be provided. The chip package may include: a first die; at least one second die disposed over the first die; and a lid disposed over lateral portions of the first die and at least partially surrounding the at least one second die, the lid having inclined sidewalls spaced apart from and facing the at least one second die.

According to various embodiments presented herein, a chip package may be provided. The chip package may include: a substrate; a first die disposed over the substrate; at least one second die disposed over the first die; and a lid at least partially surrounding the first die and the at least one second die, the lid having first portions and overhanging portions, the first portions of the lid disposed over the substrate and spaced apart from the first die, the overhanging portions of the lid disposed over the first portions of the lid and extending towards the at least one second die, the overhanging portions of the lid disposed over lateral portions of the first die and spaced apart from the at least one second die.

According to various embodiments presented herein, a method of manufacturing a chip package may be provided. The method may include: providing a chip stack including a substrate and a first die having at least one second die disposed thereon; attaching a lid to the chip stack, the lid comprising first portions and overhanging portions, the first portions of the lid attached to the substrate and spaced apart from the first die, the overhanging portions of the lid disposed over the first portions of the lid, extending towards the at least one second die, and attached to lateral portions of the first die; and dispensing a molding compound in a space between the at least one second die and surfaces of the overhanging portions of the lid facing the at least one second die, the molding compound encapsulating at least a portion of the at least one second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package comprising:
a first integrated circuit die;
at least one second integrated circuit die disposed over the first integrated circuit die; and
a lid disposed over lateral portions of the first integrated circuit die and at least partially surrounding the at least one second integrated circuit die, the lid having inclined sidewalls spaced apart from and facing the at least one second integrated circuit die, the lid continuously extending laterally from the inclined sidewalls to a vertical outer edge of the lid, wherein
no portion of the lid is disposed over the at least one second integrated circuit die,
a top surface of an uppermost die of the at least one second integrated circuit die has a first distance to a top surface of the first integrated circuit die,
a topmost surface of the lid has a second distance to the top surface of the first integrated circuit die,
the first distance being larger than the second distance, and
the first distance and the second distance are measured in a direction orthogonal to a plane formed by the top surface of the uppermost die of the at least one second integrated circuit die.

2. The chip package of claim 1, wherein a portion of the inclined sidewalls proximate the first integrated circuit die is spaced apart from the at least one second integrated circuit die by a first distance, wherein a portion of the inclined sidewalls distal the first integrated circuit die is spaced apart from the at least one second integrated circuit die by a second distance greater than the first distance.

3. The chip package of claim 2, wherein the first distance is in a range from about 100 micrometers to about 300 micrometers.

4. The chip package of claim 2, wherein the second distance is in a range from about 300 micrometers to about 700 micrometers.

5. The chip package of claim 1, wherein an incline angle of the inclined sidewalls of the lid is in a range from about 45 degrees to about 75 degrees.

6. The chip package of claim 1, wherein a lateral extent of the lateral portions of the first integrated circuit die over which the lid is disposed is in a range from about 600 micrometers to about 1000 micrometers.

7. The chip package of claim 1, further comprising a molding compound disposed between the inclined sidewalls of the lid, the molding compound at least partially encapsulating the at least one second integrated circuit die.

8. The chip package of claim 1, further comprising a heat sink disposed over the at least one second integrated circuit die, wherein a lateral extent of the heat sink is larger than a lateral extent of the first integrated circuit die.

9. The chip package of claim 1, further comprising a substrate, wherein the first integrated circuit die is disposed over the substrate.

10. A chip package comprising:
a semiconductor substrate;
a first die disposed over the semiconductor substrate;

at least one second die disposed over the first die;

a lid at least partially surrounding the first die and the at least one second die, the lid having first portions and overhanging portions, the first portions of the lid disposed over the semiconductor substrate and spaced apart from the first die, the overhanging portions of the lid disposed over the first portions of the lid and extending towards the at least one second die, the overhanging portions of the lid and the first portions of the lid comprising a continuous and homogenous material, the overhanging portions of the lid disposed over lateral portions of the first die and spaced apart from the at least one second die, wherein no portion of the lid is disposed over the at least one second die; and a molding compound at least partially encapsulating the at least one second die and disposed over a surface of the first die between the lateral portions of the first die, wherein a top surface of a topmost die of the at least one second die is offset in a direction perpendicular to the top surface of the topmost die of the at least one second die with a top surface of the molding compound and a top surface of the lid, wherein the top surface of the topmost die of the at least one second die is a first distance from the surface of the first die in the perpendicular direction, wherein the top surface of the molding compound and the top surface of the lid are a second distance from the surface of the first die in the perpendicular direction, and wherein the offset causes the first distance to be greater than the second distance.

11. The chip package of claim 10, wherein the overhanging portions of the lid have inclined sidewalls disposed over the lateral portions of the first die and facing the at least one second die.

12. The chip package of claim 11, wherein an incline angle of the inclined sidewalls of the overhanging portions of the lid is in a range from about 45 degrees to about 75 degrees.

13. The chip package of claim 10, further comprising:
a first adhesive layer disposed between the first portions of the lid and the semiconductor substrate; and
a second adhesive layer disposed between the overhanging portions of the lid and the lateral portions of the first die.

14. The chip package of claim 10, wherein a surface of the molding compound facing away from the first die is substantially co-planar with a surface of the lid facing away from the semiconductor substrate.

15. The chip package of claim 10, wherein the molding compound is in direct physical contact with surfaces of the overhanging portions of the lid facing the at least one second die.

16. The chip package of claim 10, further comprising a heat sink disposed over the overhanging portions of the lid and the at least one second die, wherein a third adhesive layer is disposed between the heat sink and the lid, wherein a fourth adhesive layer is disposed between the at least one second die and the heat sink, and wherein an air gap is disposed laterally between the third adhesive layer and the fourth adhesive layer.

17. A chip package, comprising:
a first die disposed over a substrate;
at least one second die stacked over the first die;
a conductive lid having first portions disposed over the substrate and laterally separated from the first die, the conductive lid further having overhanging portions disposed over the first portions of the conductive lid and lateral portions of the first die, the overhanging portions of the conductive lid laterally separated from the at least one second die; and
a molding compound encapsulating a top, bottom, and side walls of the at least one second die, wherein no portion of the conductive lid covers the at least one second die, wherein
no portion of the conductive lid is disposed over the at least one second die,
a topmost surface of a topmost die of the at least one second die is in a first plane,
a topmost surface of the molding compound is in a second plane, and
the first plane and the second plane are offset,
wherein a top surface of the substrate is in a third plane, the first plane being at a first distance from the third plane, the second plane being at a second distance from the third plane, and the first distance being larger than the second distance, the first and second distances measured orthogonally to the first plane.

18. The chip package of claim 17, further comprising a heat sink attached to surfaces of the conductive lid facing away from the substrate.

19. The chip package of claim 17, further comprising a first adhesive layer attaching the first portions of the conductive lid to the substrate.

20. The chip package of claim 1, wherein at least one integrated circuit die is used in a microelectromechanical system (MEMS).

21. The chip package of claim 9, further comprising an underfill layer wherein the underfill layer is disposed between a first surface of the first integrated circuit die facing the substrate and a first surface of the substrate facing the first integrated circuit die.

22. The chip package of claim 10, wherein the first die is an integrated circuit.

* * * * *